United States Patent [19]
Albu et al.

[11] Patent Number: 6,060,902
[45] Date of Patent: May 9, 2000

[54] PROGRAMMABLE CLOCK MANAGER FOR A PROGRAMMABLE LOGIC DEVICE THAT CAN BE PROGRAMMED WITHOUT RECONFIGURING THE DEVICE

[76] Inventors: Lucian R. Albu, 215 W. 75th St., Apt. 7C, New York, N.Y. 10023; Barry K. Britton, 6219 Vista Ter., Orefield, Pa. 18069; Wai-Bor Leung, 5170 Celia Dr., Wescosville, Pa. 18106; Richard G. Stuby, Jr., 6476 Warden Rd., New Tripoli, Pa. 18066; James A. Thompson, 4951 Highridge Cir., Schnecksville, Pa. 18078; Zeljko Zilic, 1206 E. Woodlawn St., Allentown, Pa. 18103

[21] Appl. No.: 08/950,448

[22] Filed: Oct. 15, 1997

[51] Int. Cl.$^7$ ..................................................... G06F 7/38
[52] U.S. Cl. .............................................. 326/38; 326/40
[58] Field of Search ................................ 326/38, 39, 40, 326/41, 93

[56] References Cited

U.S. PATENT DOCUMENTS

| | | |
|---|---|---|
| 4,940,909 | 7/1990 | Mulder et al. .......................... 307/465 |
| 5,144,645 | 9/1992 | Schiffmann ............................... 377/47 |
| 5,258,668 | 11/1993 | Cliff et al. ............................... 307/465 |
| 5,260,611 | 11/1993 | Cliff et al. ............................... 307/465 |
| 5,280,203 | 1/1994 | Hung et al. .............................. 307/456 |
| 5,391,942 | 2/1995 | El-Ayat et al. ........................... 326/39 |
| 5,394,033 | 2/1995 | Tsui et al. ................................. 326/41 |
| 5,475,322 | 12/1995 | MacDonald .............................. 326/93 |
| 5,506,878 | 4/1996 | Chiang ..................................... 377/39 |
| 5,666,322 | 9/1997 | Conkle .................................... 365/233 |
| 5,680,061 | 10/1997 | Veenstra et al. .......................... 326/38 |
| 5,742,180 | 4/1998 | DeHon et al. ............................ 326/40 |
| 5,760,609 | 6/1998 | Sharpe-Geisler ......................... 326/93 |
| 5,802,132 | 9/1998 | Pathikonda et al. ..................... 327/115 |

*Primary Examiner*—David Nelms
*Assistant Examiner*—Anh Phung

[57] ABSTRACT

A programmable logic device (PLD), such as a field programmable gate array (FPGA), has a programmable clock manager (PCM) that converts an input clock into at least one output clock and the PCM can be programmed during PLD operations, without reconfiguring the PLD.

16 Claims, 10 Drawing Sheets

Table 1. PCM Registers

| Address | Function |
|---|---|
| 0 | Divider 0 Programming. Programmable divider, DIV0, value and DIV0 reset bit. DIV0 can divide the input clock to the PCM or can be bypassed. |
| 1 | Divider 1 Programming. Programmable divider, DIV1, value and DIV1 reset bit. DIV1 can divide the feedback clock input to the PCM or can be bypassed. Valid only in PLL mode. |
| 2 | Divider 2 Programming. Programmable divider, DIV2, value and DIV2 reset bit. DIV2 can divide the output of the tapped delay line or can be bypassed and is only valid for the ExpressCLK output. |
| 3 | DLL 2x Duty-Cycle Programming. DLL mode clock doubler (2x) duty cycle selection. |
| 4 | DLL 1x Duty-Cycle Programming. Depending on the settings in other registers, this register is for:<br>a. PLL mode phase/delay selection;<br>b. DLL mode 1x duty cycle selection; and<br>c. DLL mode programmable delay. |
| 5 | Mode Programming. DLL/PLL mode selection. DLL 1x/2x clock selection, phase detector feedback selection. |
| 6 | Clock Source Status/Output Clock Selection Programming. Input clock selection, feedback clock selection, ExpressCLK output source selection, system clock output source selection. |
| 7 | PCM Control Programming. PCM power, reset, and configuration control. |

Table 2. DLL Mode Delay/1x Duty Cycle Programming Values

| Register 4[7:0]<br>7 6 5 4 3 2 1 0 | Delay<br>(CLK_IN/32) | Duty Cycle<br>(% of CLK_IN) |
|---|---|---|
| 0 0 X X X 0 0 0 | 1 | 3.125 |
| 0 0 X X X 0 0 1 | 2 | 6.250 |
| 0 0 X X X 0 1 0 | 3 | 9.375 |
| 0 0 X X X 0 1 1 | 4 | 12.500 |
| 0 0 X X X 1 0 0 | 5 | 15.625 |
| 0 0 X X X 1 0 1 | 6 | 18.750 |
| 0 0 X X X 1 1 0 | 7 | 21.875 |
| 0 0 X X X 1 1 1 | 8 | 25.000 |
| 0 1 X X X 0 0 0 | 9 | 28.125 |
| 0 1 X X X 0 0 1 | 10 | 31.250 |
| 0 1 X X X 0 1 0 | 11 | 34.375 |
| 0 1 X X X 0 1 1 | 12 | 37.500 |
| 0 1 X X X 1 0 0 | 13 | 40.625 |
| 0 1 X X X 1 0 1 | 14 | 43.750 |
| 0 1 X X X 1 1 0 | 15 | 46.875 |
| 0 1 1 1 1 X X X | 16 | 50.000 |
| 1 0 0 0 0 X X X | 17 | 53.125 |
| 1 0 0 0 1 X X X | 18 | 56.250 |
| 1 0 0 1 0 X X X | 19 | 59.375 |
| 1 0 0 1 1 X X X | 20 | 62.500 |
| 1 0 1 0 0 X X X | 21 | 65.625 |
| 1 0 1 0 1 X X X | 22 | 68.750 |
| 1 0 1 1 0 X X X | 23 | 71.875 |
| 1 0 1 1 1 X X X | 24 | 75.000 |
| 1 1 0 0 0 X X X | 25 | 78.125 |
| 1 1 0 0 1 X X X | 26 | 81.250 |
| 1 1 0 1 0 X X X | 27 | 84.375 |
| 1 1 0 1 1 X X X | 28 | 87.500 |
| 1 1 1 0 0 X X X | 29 | 90.625 |
| 1 1 1 0 1 X X X | 30 | 93.750 |
| 1 1 1 1 0 X X X | 31 | 96.875 |

Table 3. DLL Mode Delay/2x Duty Cycle Programming Values

| Register 3[7:0]<br>7 6 5 4 3 2 1 0 | Duty Cycle (%) |
|---|---|
| 0 0 0 0 0 0 0 0 | 6.25 |
| 0 0 0 0 1 0 0 1 | 12.50 |
| 0 0 0 1 0 0 1 0 | 18.75 |
| 0 0 0 1 1 0 1 1 | 25.00 |
| 0 0 1 0 0 1 0 0 | 31.25 |
| 0 0 1 0 1 1 0 1 | 37.50 |
| 0 0 1 1 0 1 1 0 | 43.75 |
| 0 0 1 1 1 1 1 1 | 50.00 |
| 1 1 0 0 0 0 0 0 | 56.25 |
| 1 1 0 0 1 0 0 1 | 62.50 |
| 1 1 0 1 0 0 1 0 | 68.75 |
| 1 1 0 1 1 0 1 1 | 75.00 |
| 1 1 1 0 0 1 0 0 | 81.25 |
| 1 1 1 0 1 1 0 1 | 87.50 |
| 1 1 1 1 0 1 1 0 | 93.75 |

Table 4. PCM Oscillator Frequency Range

| Register 4<br>7 6 5 4 3 2 1 0 | Min. | System Clock Output Frequency (MHz) Nom. | Max. |
|---|---|---|---|
| 0 0 X X X 0 0 0 | 12.80 | 102.40 | 192.00 |
| 0 0 X X X 0 0 1 | 12.54 | 81.52 | 150.50 |
| 0 0 X X X 0 1 0 | 12.28 | 79.85 | 147.41 |
| 0 0 X X X 0 1 1 | 12.03 | 78.17 | 144.31 |
| 0 0 X X X 1 0 0 | 11.77 | 76.49 | 141.21 |
| 0 0 X X X 1 0 1 | 11.51 | 74.81 | 138.12 |
| 0 0 X X X 1 1 0 | 11.25 | 73.14 | 135.02 |
| 0 0 X X X 1 1 1 | 10.99 | 71.46 | 131.92 |
| 0 1 X X X 0 0 0 | 10.74 | 69.78 | 128.83 |
| 0 1 X X X 0 0 1 | 10.48 | 68.10 | 125.73 |
| 0 1 X X X 0 1 0 | 10.22 | 66.43 | 122.63 |
| 0 1 X X X 0 1 1 | 9.96 | 64.75 | 119.54 |
| 0 1 X X X 1 0 0 | 9.70 | 63.07 | 116.44 |
| 0 1 X X X 1 0 1 | 9.45 | 61.39 | 113.34 |
| 0 1 X X X 1 1 0 | 9.19 | 59.72 | 110.25 |
| 0 1 X X X 1 1 1 | 8.93 | 58.04 | 107.15 |
| 1 0 0 0 0 X X X | 8.67 | 56.36 | 104.05 |
| 1 0 0 0 1 X X X | 8.41 | 54.68 | 100.95 |
| 1 0 0 1 0 X X X | 8.15 | 53.01 | 97.86 |
| 1 0 0 1 1 X X X | 7.90 | 51.33 | 94.76 |
| 1 0 1 0 0 X X X | 7.64 | 49.65 | 91.66 |
| 1 0 1 0 1 X X X | 7.38 | 47.97 | 88.57 |
| 1 0 1 1 0 X X X | 7.12 | 46.30 | 85.47 |
| 1 0 1 1 1 X X X | 6.86 | 44.62 | 82.37 |
| 1 1 0 0 0 X X X | 6.61 | 42.94 | 79.28 |
| 1 1 0 0 1 X X X | 6.35 | 41.26 | 76.18 |
| 1 1 0 1 0 X X X | 6.09 | 39.59 | 73.08 |
| 1 1 0 1 1 X X X | 5.83 | 37.91 | 69.99 |
| 1 1 1 0 0 X X X | 5.57 | 36.23 | 66.89 |
| 1 1 1 0 1 X X X | 5.32 | 34.55 | 63.79 |
| 1 1 1 1 0 X X X | 5.06 | 32.88 | 60.70 |
| 1 1 1 1 1 X X X | 4.80 | 31.20 | 57.60 |

Table 5.
PCM Control Registers

| Bit # | Function |
|---|---|
| Register 0-Divider 0 Programming | |
| Bits [3:0] | 4-Bit Divider, DIV0, Value. This value enables the input clock to immediately be divided by a value from 1 to 8. A 0 value (the default) indicates that DIV0 is bypassed (no division). Bypass incurs less delay than dividing by 1. Hexadecimal values greater than 8 for bits [3:0] yield their modulo 8 value. For example, if bits [3:0] are 1001 (9 hex), the result is divide by 1 (remainder 9/8=1). |
| Bits[6:4] | Reserved |
| Bit 7 | DIV0 Reset Bit. DIV0 may not be reset by GRSN depending on the value of register 7, bit 7. This bit may be set to 1 to reset DIV0 to its default value. Bit 0 must be set to 0 (the default) to remove the reset. |
| Register 1-Divider 1 Programming | |
| Bits [3:0] | 4-Bit Divider, DIV1, Value. This value enables the feedback clock to be divided by a value from 1 to 8. A 0 value (the default) indicates that DIV1 is bypassed (no division). Bypass incurs less delay than dividing by 1. Hexadecimal values greater than 8 for bits [3:0] yield their modulo 8 value. For example, if bits [3:0] are 1001 (9 hex), the result is divide by 1 (remainder 9/8=1). |
| Bits[6:4] | Reserved |
| Bit 7 | DIV1 Reset Bit. DIV1 may not be reset by GRSN, depending on the value of register 7, bit 7. This bit may be set to 1 to reset DIV1 to its default value. Bit 0 must be set to 0 (the default) to remove the reset. |
| Register 2-Divider 2 Programming | |
| Bits [3:0] | 4-Bit Divider, DIV2, Value. This value enables the tapped delay line output clock driven onto ExpressCLK to be divided by a value from 1 to 8. A 0 value (the default) indicates that DIV2 is bypassed (no division). Bypass incurs less delay than dividing by 1. Hexadecimal values greater than 8 bits [3:0] yield their modulo 8 value. For example, if bits [3:0] are 1001 (9 hex), the result is divide by 1 (remainder 9/8 = 1). |
| Bits[6:4] | Reserved |
| Bit 7 | DIV2 Reset Bit. DIV2 may not be reset by GRSN, depending on the value of register 7, bit 7. This bit may be set to 1 to reset DIV2 to its default value. Bit 7 must be set to 0 (the default) to remove the reset. |
| Register 3-DLL 2x Duty-Cycle Programming | |
| Bits[2:0] | Duty-cycle selection for the doubled clock period associated with the input clock high. The duty cycle is (value of bit 6)*50% + (value of bits [2:0])*6.25%. See the description for bit 6. |
| Bits[5:3] | Duty-cycle selection for the doubled clock period associated with the input clock low. The duty cycle is (value of bit 7)*50% + (value of bits [2:0])*6.25%. See the description for bit 7. |
| Bits 6 | Master duty-cycle control for the first clock period of the doubled clock: 0 = less than or equal to 50%, 1=greater than 50%. |
| Bits 7 | Master duty-cycle control for the second clock period of the doubled clock: 0 = less than or equal to 50%, 1=greater than 50%. Example: Both clock periods having a 62.5% duty cycle, bits [7:0] are 11 001 001. |

Table 5:PCM Control Registers (Continued)

| Bit # | Function |
|---|---|
| Register 4--DLL 1x Duty-Cycle Programming | |
| Bits [2:0] | Duty Cycle/Delay Selection for Duty Cycles/Delay Less Than or Equal To 50%. The duty cycle/delay is (value of bits [7:6])*25%+((value of bits [2:0])+1)*3.125%. See the description for bits [7:6]. |
| Bits [5:3] | Duty Cycle/Delay Selection for Duty Cycles/Delay Greater Than 50%. The duty cycle/delay is (value of bits [7:6])*25%+((value of bits [5:3])+1)*3.125%. See the description for bits [7:6]. |
| Bits [7:6] | Master Duty-Cycle Control:<br>00: duty cycle 3.125% to 25%<br>01: duty cycle 28.125% to 50%<br>10: duty cycle 53.125% to 75%<br>11: duty cycle 78.125% to 96.875%<br><br>Example: A 40.625% duty cycle, bits [7:0] are 01 XXX 100, where X is a don't care because the duty cycle is not greater than 50%.<br><br>Example: The PCM output clock should be delayed 96.875% (31/32) of the input clock period. Bits [7:0] are 1110XXX, which is 78.125% from bits [7:6] and 18.75% from bits [5:3]. Bits [2:0] are don't care (X) because the delay is greater than 50%. |
| Register 5--Mode Programming | |
| Bit 0 | DLL/PLL Mode Selection Bit. 0=DLL, 1=PLL. Default is DLL mode. |
| Bit 1 | Reserved. |
| Bit 2 | PLL Phase Detector Feedback Input Selection Bit. 0 = feedback signal from routing/Express-CLK. 1 = feedback from programmable delay line output. Default is 0. Has no effect in DLL mode. |
| Bit 3 | Reserved. |
| Bit 4 | 1x/2x Clock Selection Bit for DLL Mode. 0 = 1x clock output, 1 = 2x clock output. Default is 1x clock output. Has no effect in PLL mode. |
| Bit[7:5] | Reserved. |

Table 5:PCM Control Registers (Continued)

| Bit # | Function |
|---|---|
| Register 6-Clock Source Status/Output Clock Selection Programming | |
| Bits [1:0] | Read Only. These bits are set up via the configuration bit stream to indicate the input clock source to the PCM. Default is clock input tied low (00).<br>00:clock input tied low<br>01:ExpressCLK corner pad<br>10:general routing<br>11:general routing |
| Bits [3:2] | READ ONLY. These bits are set up via the configuration bit stream to indicate the feedback clock source to the PCM. Default is 00.<br>00:ExpressCLK dedicated feedback path<br>01:general routing<br>10:general routing<br>11:general routing |
| Bits [5:4] | ExpressCLK Output Source Selector. Default is 00.<br>00:PCM input clock, bypass path through PCM<br>01:DLL output<br>10:tapped delay line output<br>11:divided (DIV2) delay line output |
| Bits [7:6] | System Clock Output Source Selector. Default is 00.<br>00:PCM input clock, bypass path through PCM<br>01:DLL output<br>10:tapped delay line output<br>11:reserved |
| Register 7-PCM Control Programming | |
| Bit 0 | PCM Analog Power Supply Switch. 1 = power supply on, 0 = power supply off. |
| Bit 1 | PCM Reset. A value of 1 resets all PCM logic for PLL and DLL modes. |
| Bit 2 | DLL Reset. A value of 1 resets the clock generation logic for DLL mode. No dividers or user registers are affected. |
| Bit[5:3] | Reserved. |
| Bit 6 | PCM Configuration Operation Enable Bit. 0 = normal configuration operation. During configuration (DONE=0), the PCM analog power supply will be off, the PCM output data bus is 3-stated, and the LOCK signal is asserted to logic 0. The PCM will powerup when DONE = 1. 1 = PCM operation during configuration. The PCM may be poweredup (see bit 0) and begin operation, or continue operation. The setup of the PCM can be performed via the configuration bit stream. |
| Bit 7 | PCM GSRN Enable Bit. 0 = normal GSRN operation. 1 = GSRN has no effect on PCM logic, so clock processing will not be interrupted by a chip reset. Default is 0. |

PROGRAMMABLE CLOCK MANAGER FOR A PROGRAMMABLE LOGIC DEVICE THAT CAN BE PROGRAMMED WITHOUT RECONFIGURING THE DEVICE

BACKGROUND OF THE INVENTION

1. Field of the Invention

The present invention relates to integrated circuits, and, in particular, to high-density programmable logic devices, such as field programmable gate arrays.

2. Description of the Related Art

The advent of high-density programmable logic devices (PLDs), such as field programmable gate arrays (FPGAs), has brought with it difficulties in managing clock delay and clock skew on the devices. What is needed is a clock manager for FPGAs and other programmable logic devices that addresses these needs and other issues in modern systems. These other issues include system functions such as frequency synthesis and pulse-width modulation, as well as system design issues such as allowing a reduced clock frequency on system printed circuit boards while allowing high-speed processing on the FPGA.

SUMMARY OF THE INVENTION

The present invention addresses the issues of minimizing clock delay and skew. The invention also provides, as part of its basic nature, facilities for programmable clock duty-cycle adjustment, clock doubling with independent duty-cycle adjustment on the doubled clock periods, clock-phase adjustment, clock multiplication, and multiple clock outputs with the capability to have one set of device registers (e.g., input/output registers) clocked at a different rate than another set of registers (e.g., internal registers). These features are all programmable by the user, either during device configuration or during user operation via a direct interface. All of these features address needs in modem systems with applicability toward system functions such as frequency synthesis and pulse-width modulation, as well as addressing system design issues such as allowing a reduced clock frequency on system printed circuit boards while allowing high-speed processing on the FPGA.

The present invention is directed to a programmable logic device, such as an FPGA, having a programmable clock manager (PCM). The PCM is a dedicated circuit that allows the device to mitigate on-device clock-delay and clock-skew issues, provide necessary system clock facilities, and provide enhanced on-device clocking capabilities. The PCM is programmable via configuration or by interface to the device user-defined logic and multiple copies of the PCM circuit may be used alone or in conjunction on a single device.

In one preferred embodiment, the present invention is a programmable logic device (PLD) having at least one programmable clock manager (PCM), wherein (1) the PCM is adapted to convert an input clock into at least two different output clocks having different clock rates, (2) the PCM is adapted to be programmed during PLD operations, without reconfiguring the PLD, and (3) the PCM is adapted to perform one or more delay-locked loop (DLL) functions.

BRIEF DESCRIPTION OF DRAWINGS

Other aspects, features, and advantages of the present invention will become more fully apparent from the following detailed description, the appended claims, and the accompanying drawings in which:

Table 1 shows the function of PCM Registers.

Table 2 shows the function of Delay-Locked Loop (DLL) Mode.

Table 3 shows the DLL Mode Delay/2x Duty Cycle Programming Values.

Table 4 shows the PCM Oscillator Frequency Range.

Table 5 shows the function of PCM Control Registers.

DETAILED DESCRIPTION

Figure 1:
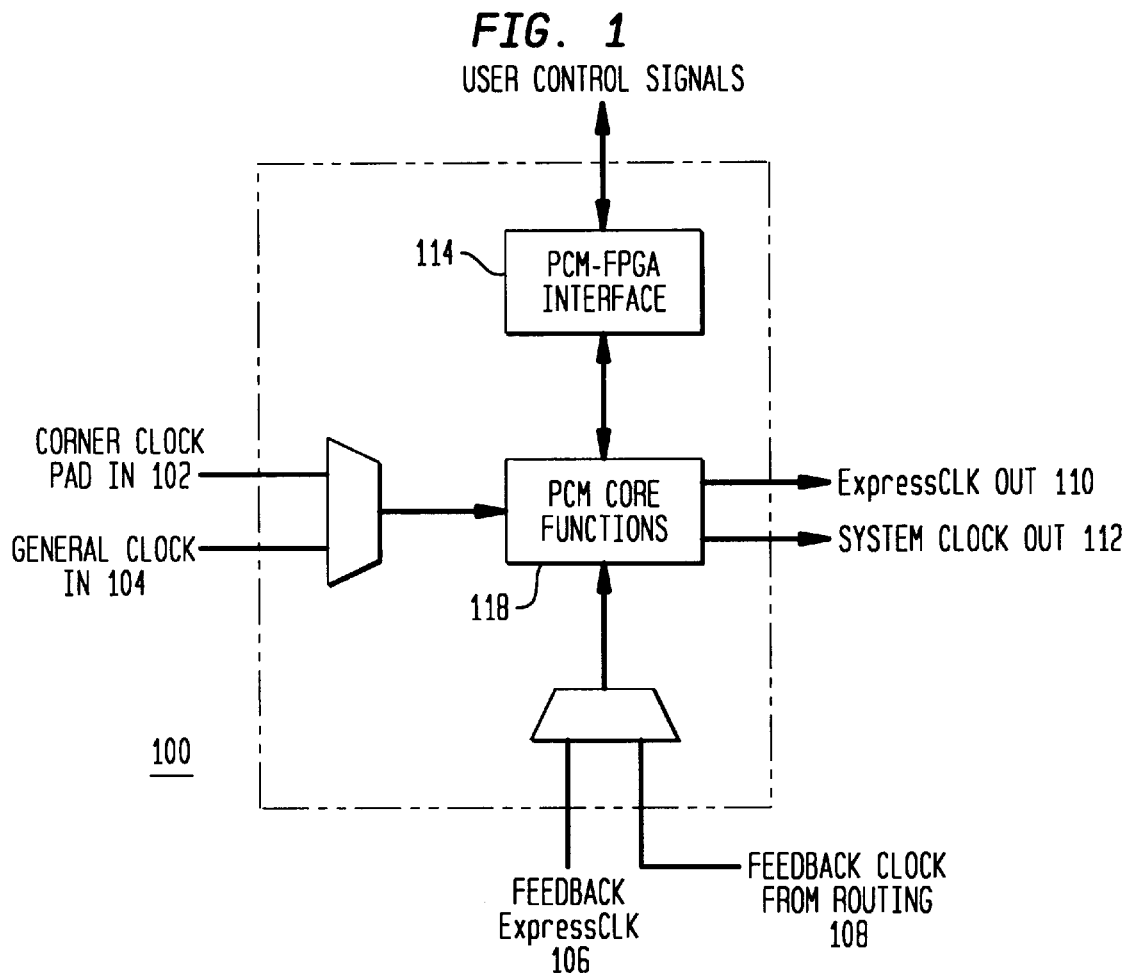
FIG. 1 shows a high-level block diagram of a programmable clock manager implemented in an FPGA, according to one embodiment of the present invention.

FIG. 1 shows a high-level block diagram of a programmable clock manager 100 implemented in an FPGA, according to one embodiment of the present invention. PCM 100 is a special function block that is used to modify or condition clock signals for optimum system performance. Some of the functions that can be performed with PCM 100 are clock-skew reduction, duty-cycle adjustment, clock multiplication, clock-delay reduction, and clock-phase adjustment. By using programmable logic cell (PLC) logic resources in conjunction with the PCM, many other functions, such as frequency synthesis, are possible.

In one embodiment of the present invention, the FPGA has two PCMs, one in the lower left corner and one in the upper right corner. As shown in FIG. 1, each PCM can take a clock input from the dedicated clock pad in its corner (102) or from general routing resources (104). There are also two input sources that provide feedback to the PCM from the PLC array. One of these is a dedicated ExpressCLK feedback (106), and the other is from general routing (108). The PCM sources two clock outputs, one to the ExpressCLK (110) feeding the two sides adjacent to the PCM, and one to the system clock spine network (112).

Figure 2:
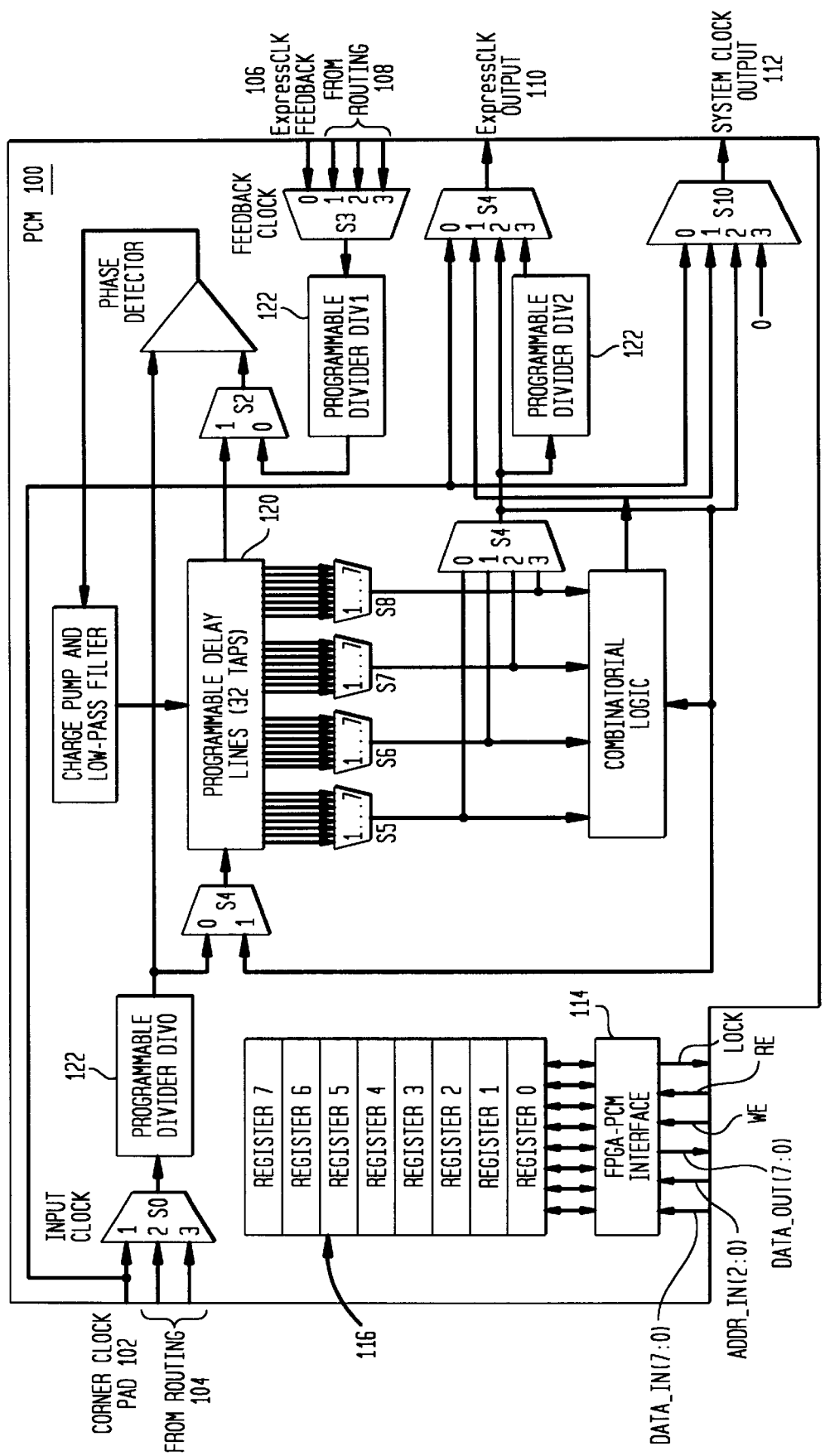
FIG. 2 shows a more-detailed functional block diagram of the PCM of FIG. 1.

FIG. 2 shows a more-detailed functional block diagram of PCM 100 of FIG. 1. Functionality of the PCM is programmed during operation through a read/write interface 114 internal to the FPGA array or via the configuration bit stream. The internal FPGA interface 114 comprises write enable (WE) and read enable (RE) signals, a 3-bit address bus (ADDR$_{13}$ IN[2:0]), an 8-bit input (to the PCM) data bus (DATA$_{13}$ IN[7:0]), and an 8-bit output data bus (DATA$_{13}$ OUT[7:0]). These signals are used to program a series of registers 116 to configure the PCM functional core (118 in FIG. 1) for the desired functionality. There is also a PCM output signal (LOCK) that indicates a stable output-clock state.

Operation of the PCM is divided into two modes, delay-locked loop (DLL) and phase-locked loop (PLL). Some operations can be performed by either mode and some are specific to a particular mode. These operations are described below. In general, DLL mode is preferable to PLL mode for the same function, because it is less sensitive to input-clock noise.

For purposes of this specification, the term "duty cycle" refers to the percentage of the clock period during which the clock signal is high.

PCM Registers

PCM 100 contains eight user-programmable registers 116 used for configuring the PCM's functionality. Table 1 shows the mapping of the registers and their functions. Detailed explanations of all register bits are supplied following the functional description of the PCM.

Delay-Locked Loop (DLL) Mode

DLL mode is used to implement the following three functions: a delayed clock (phase adjustment), clock doubling, and duty-cycle adjustment. All DLL functions stem from a delay line 120 with n taps, where n=32 in the embodiment of FIG. 2. The delayed input clock is pulled from various taps and processed to implement the desired result. There is no feedback clock in DLL mode, providing a very stable output and an acquisition lock time for the output clock.

DLL mode is selected by setting Bit 0 in Register 5 to a 0. The settings for the various sub-modes of DLL mode are described in the following paragraphs. Divider DIV0 may be used with any of the DLL modes to divide the input clock by an integer factor of 1 to m prior to implementation of the DLL process, where m=8 in the embodiment of FIG. 2.

Delayed Clock

A delayed version of the input clock can be constructed in DLL mode. The output clock can be delayed by increments of 1/n of the input clock period, where n=32 in the embodiment of FIG. 2. Delay mode can be selected for ExpressCLK output 110 and/or for system clock output 112. The delay value is entered in Register 4. Delay values are shown in the second column of Table 2.

Note that the ExpressCLK output can be divided by an integer factor from 1 to m, while the system clock cannot be divided, where m=8 in the embodiment of FIG. 2. The ExpressCLK divider is provided so that the I/O clocking provided by the ExpressCLK can operate slower than the internal system clock. This allows for very fast internal processing while maintaining slower interface speeds off-chip for improved noise and power performance or to inter-operate with slower devices in the system. The divisor of the ExpressCLK frequency is selected in Register 2.

1× Clock Duty-Cycle Adjustment

A duty-cycle adjusted replica of the input clock can be constructed in DLL mode. The duty cycle can be adjusted in 1/n increments of the input clock period, where n=32 in the embodiment of FIG. 2. When in DLL 1× clock mode, duty-cycle adjustment can be selected for ExpressCLK output 110 and/or for system clock output 112. The duty-cycle percentage value is entered in Register 4. Duty cycle values are shown in the third column of Table 2.

2× Clock Duty-Cycle Adjustment

A doubled-frequency, duty-cycle adjusted version of the input clock can be constructed in DLL mode. The first clock cycle of the 2× clock output occurs when the input clock is high, and the second cycle occurs when the input clock is low. Each of the two doubled-clock cycles that occurs in a single input clock cycle may optionally be adjusted to have a different duty cycle. The duty cycles can be independently adjusted in 2/n increments of the input clock period, where n=32 in the embodiment of FIG. 2. DLL 2× clock mode can be selected for ExpressCLK output 110 and/or for system clock output 112. The duty-cycle percentage value is entered in Register 3. Duty-cycle values where both cycles of the doubled clock have the same duty cycle are shown in Table 3.

Phase-Locked Loop (LL) Mode

The PLL mode of the PCM is used for clock multiplication and clock-delay minimization functions. PLL functions make use of the PCM dividers 122 and use feedback signals, often from the FPGA array. The use of feedback is discussed with each PLL sub-mode.

Clock-Delay Minimization

PLL mode can be used to minimize the effects of the input buffer and input routing delay on the clock signal. PLL mode causes the feedback clock (106 or 108) to align in phase with the input clock (102 or 104), so that the delay between the input clock and a clock that is fed back to the PCM is effectively eliminated.

Figure 3:
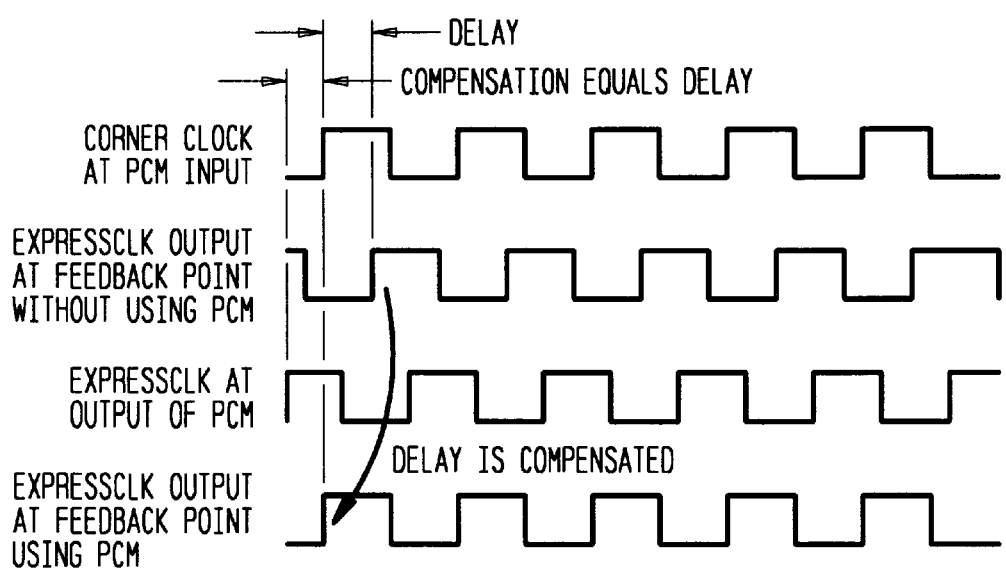
FIG. 3 depicts the relationships between clock signals during PCM delay minimization.

There is a dedicated feedback path 106 from a dedicated point in the clock routing (e.g., in the middle of an adjacent side) to the PCM. Using the dedicated corner clock pad 102 as the input to the PCM and using the dedicated feedback path 106, the clock from the ExpressCLK output 110 of the PCM, as viewed at the clock routing feedback point, will be phase-aligned with the corner clock input 102 to the PCM. These relationships are depicted in FIG. 3.

A feedback clock 108 can also be input to the PCM from general routing. This allows for compensating for delay between the PCM input and a point in the general routing.

Clock Multiplication

An output clock that is a multiple (not necessarily an integer multiple) of the input clock can be generated in PLL mode. The multiplication ratio is programmed in the division registers DIV0, DIV1, and DIV2 (122). The clock-multiplication formulas when using ExpressCLK feedback are:

$$F_{ExpressCLK\_OUT} = F_{INPUT\_CLOCK} \cdot DIV1/DIV0$$

$$F_{SYSTEM\_CLOCK\_OUT} = F_{ExpressCLK\_OUT} \cdot DIV2$$

where the values of DIV0, DIV1, and DIV2 independently range from 1 to m, where m=8 in the embodiment of FIG. 2. In alternative embodiments, each division register DIVi could have a different range of possible values. The ExpressCLK_OUT multiplication range of output clock frequencies is, therefore, from ⅛ up to 8, with the system clock range up to 8 times the ExpressCLK_OUT frequency or 64 times the input clock frequency. If system clock feedback is used, the formulas are:

$$F_{SYSTEM\_CLOCK\_OUT} = F_{INPUT\_CLOCK} \cdot DIV1/DIV0$$

$$F_{ExpressCLK\_OUT} = F_{SYSTEM\_CLOCK\_OUT}/DIV2$$

The divider values DIV0, DIV1, and DIV2 are programmed in Registers 0, 1, and 2, respectively.

The multiplied output can be selected for ExpressCLK output 110 and/or for system clock output 112. The ExpressCLK output can optionally be divided by DIV2, while the system clock cannot be divided. The ExpressCLK divider is provided so that the I/O clocking provided by the ExpressCLK can operate slower than the internal system clock. This allows for very fast internal processing, while maintaining slower interface speeds off-chip for improved noise and power performance or to inter-operate with slower devices in the system.

The internal PCM oscillator should be configured for operation in the proper frequency range. Table 4 shows the preferred settings for Register 4 for different frequency ranges. The PCM oscillator frequency range is chosen based on the desired output frequency at the system clock output 112. If the ExpressCLK output 110 is used, the equivalent system clock frequency can be selected by multiplying the expected ExpressCLK output frequency by the value for DIV2, if DIV2 is used. Otherwise, the ExpressCLK and system clock outputs are equivalent. The nominal frequency that is closest to the desired frequency is chosen from Table 4, and that value is used to program Register 4. Minor adjustments to match the exact input frequency are then performed automatically by the PCM.

PCM/FPGA Internal Interface

Writing and reading the PCM registers 116 is done through a simple asynchronous interface 114 that connects with the FPGA user-defined routing resources. Reads from the PCM by the FPGA logic are accomplished by setting up the 3-bit address ADDR_IN[2:0] and then applying an active-high read enable RE pulse. The read data will be available as long as RE is held high. The address may be changed, while RE is high, to read other addresses. When RE goes low, the data output bus DATA_OUT[7:0] is tri-stated.

Writes to the PCM by the FPGA logic are performed by applying the write data to the data input bus DATA_IN[7:0] of the PCM, applying the 3-bit address ADDR_IN[2:0] to write to, and asserting the write enable WE signal high. Data will be written by the high-going transition of the WE pulse.

The read enable RE and write enable WE signals should not be active at the same time.

The LOCK signal output from the PCM to the FPGA routing indicates a stable output clock signal from the PCM. The LOCK signal is high when the PCM output clock parameters fall within the programmed values and the PCM specifications for jitter.

PCM Operation

Descriptions of bit fields and individual control bits in the PCM control registers 116 are provided in Table 5. Several features are available for the control of the PCM's overall operation. The PCM may be programmably enabled/disabled via Bit 0 of Register 7. When disabled, the analog power supply of the PCM is turned off, conserving power and eliminating the possibility of inducing noise into the system power buses.

Individual bits are provided to reset all of the PCM clock generation logic or to reset only the DLL combinatorial logic. Neither reset affects the PCM configuration settings in Registers 4 through 7. These are only affected by the global set/reset (GSRN), if enabled. For PLL mode, each of the three programmable dividers can be individually reset by a bit in each divider register. All divider registers can be reset by setting the general PCM register reset bit in Register 7. The use of any of the resets halts the output clock associated with that reset. For example, resetting divider DIV1 or DIV0 will halt the output clock (i.e., force it low).

The global set/reset is also programmably controlled via Register 7, Bit 7. If Register 7, Bit 7 is set to 1, GSRN will have no effect on the PCM logic, allowing it to operate during a global set/reset. This function allows the FPGA to be reset without affecting a clock that is sent off chip and used elsewhere in the system.

Bit 6 of Register 7 affects the functionality of the PCM during configuration. If set to 1, this bit enables the PCM to operate during configuration, after the PCM has been initially configured.

If Register 7, Bit 6 is 0, the PCM cannot function during configuration and its power supply is disabled until after the configuration DONE signal goes high.

When the PCM is powered up via Register 7, Bit 0, there is a wake-up time associated with its operation. Following the wake-up time, the PCM will begin to fully function, and, following an acquisition time during which the output clock(s) may be unstable, the PCM will be in steady-state operation. There is also a shut-down time associated with powering-off the PCM. The output clock(s) will be unstable during this period.

PCM Applications

The applications discussed below are only a small sampling of the possible uses for the PCM.

Clock-Phase Adjustment

The PCM may be used to adjust the phase of the input clock. The result is an output clock that has its active edge either preceding or following the active edge of the input clock. Clock-phase adjustment is accomplished in DLL mode by delaying the clock. This was previously discussed in the DLL section. Examples of using the delayed clock as an early or late phase-adjusted clock are outlined in the following paragraphs.

Figure 4A:
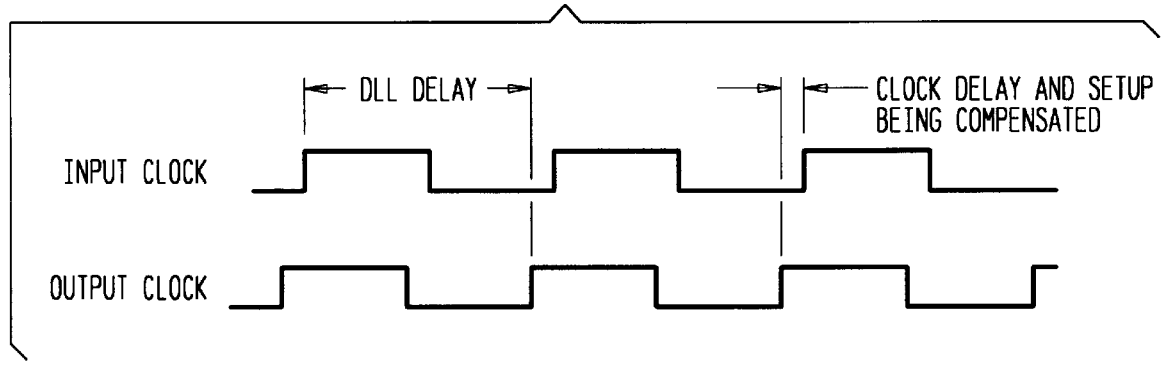
FIGS. 4A and 4B depict the relationships between clock signals during PCM clock-phase adjustment.

An output clock that precedes the input clock can be used to compensate for clock delay that is largely due to excessive loading. The preceding output clock is really not early relative to the input clock, but delayed almost a full cycle. This is shown in FIG. 4A. The amount of delay that is being compensated for, plus clock setup time and some margin, is the amount less than one full clock cycle that the output clock is delayed from the input clock.

Figure 4B:
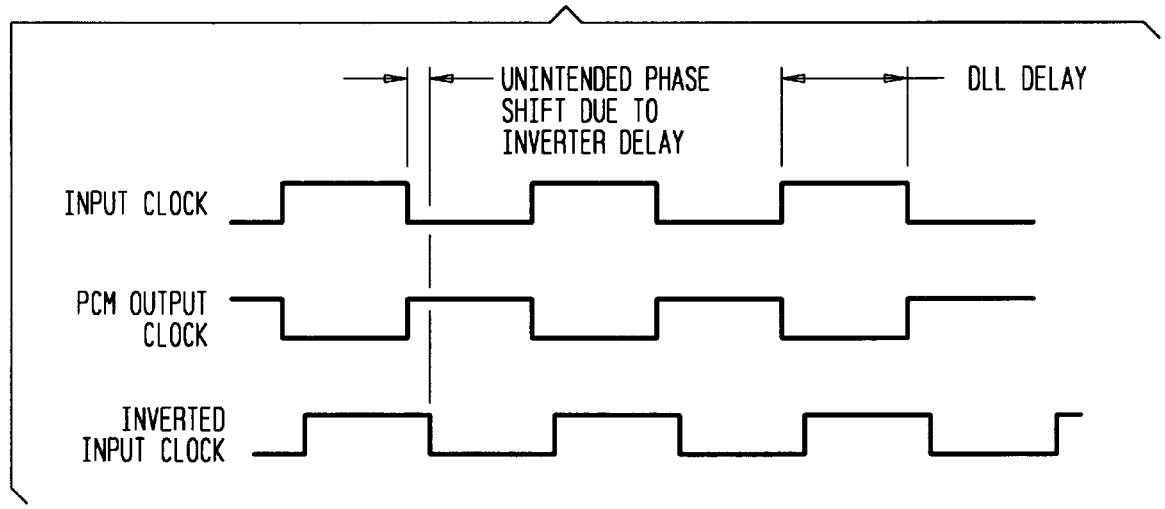

In some systems, it is desirable to operate logic from several clocks that operate at different phases. This technique is often used in microprocessor-based systems to transfer and process data synchronously between functional areas, but without incurring excessive delays. FIG. 4B shows an input clock and an output clock operating 180 degrees out of phase. It also shows a version of the input clock that was shifted approximately 180 degrees using a simple logic inverter. Note that the inverted clock is really shifted more than 180 degrees due to the propagation delay of the inverter. The PCM output clock does not suffer from this delay. Additionally, the 180-degree shifted PCM output could be shifted by some smaller amount to effect an early 180-degree shifted clock that also accounts for loading effects.

In terms of degrees of phase shift, the phase of a clock is adjustable in DLL mode with resolution relative to the delay increment (see Table 2):

For Delay≦16, Phase Adjustment=(Delay)·11.25°

For Delay>16, Phase Adjustment=(Delay)·11.25°−360°

High-Speed Internal Processing with Slow I/Os

The PCM PLL mode provides two outputs, one sent to the global system clock routing of the FPGA (112) and the other to the ExpressCLK(s) that serve the FPGA I/Os (110). The ExpressCLK output of the PCM has a divide capability (DIV2) that the system clock output does not. This feature allows an input clock to be multiplied up to a higher frequency for high-speed internal processing, and also allows the ExpressCLK output to be divided down to a lower frequency to accommodate off-FPGA data transfers. For example, a 10-MHz input clock may be multiplied to 25 MHz (e.g., DIV0=2, DIV1=5, DIV2=2) and output to the FPGA ExpressCLK. This allows the I/Os of the circuit to run at 25 MHz (i.e., (5/2)·10 MHz). The system clock will run at DIV2 times the ExpressCLK rate, which is 2 times 25 MHz, or 50 MHz. This setup allows for internal processing to occur at twice the rate of on/off device I/O transfers.

Advantages

PCM 100 of FIGS. 1 and 2 provides capabilities to reduce the effects of clock delay and skew on the FPGA, while at the same time providing facilities to enhance the clocking performance via clock multiplication, duty-cycle adjustment, and separate clock rates for internal and I/O processing. Further, the PCM can be used to implement complex system functions such as frequency synthesis or pulse-width modulation and can provide managed clocking to devices off of the FPGA even during FPGA reset or configuration.

The PCM is programmable both during configuration and during user operation via an interface to the FPGA logic. The PCM has phase-locked loop circuitry for clock-delay minimization from dedicated feedback, but also adds the ability to lock the clock to signals from general routing. Clock delay may also be adjusted in discrete steps by using the PCM's delay-locked loop circuitry. The PCM is capable of multiplying the input clock by factors from 1/8 up to 64 times in complex ratios governed by: Fout1=Fin·(A/B) and Fout2=Fout1·C, where A, B, and C are positive integers (that range from 1 to 8 in the embodiment of FIG. 2). Facilities are provided to extend the range of these factors to 1 to 16, which would provide a multiplication range from 1/16 to 256.

The discrete delay control for the PCM is performed by the delay-locked loop portion of the PCM rather than the phase-locked loop portion. The delays allow able in the FPGA are based on percentages of the input c lock frequency and not on fixed time steps, allowing for the same relative range of delay variation for all clock inputs. The use of a delay-locked loop structure is also less susceptible to system noise than is a phase-locked loop structure.

In addition to being able to stop and restart the phase-locked loop, the PCM has the capability to slowly stop or start the output clock by adjusting the output clock frequency, via clock multiplication, to transition the clock from one state (i.e., stopped or running) to the other by iteratively changing the output frequency. Further, the PCM has options to allow it to operate unaffected by a global device reset and/or a device configuration. These features allow the PCM to operate for off-device system circuitry that uses the PCM output, regardless of the FPGA state of operation, as well as for the FPGA circuitry.

There are two types of clocks described in conjunction with the PCM, ExpressCLK and system clock. The system clock is a general-purpose clock that can be sourced from any user I/O or internally generated by the FPGA logic. It can be driven throughout the device, to both the registers in the internal logic array and the registers at the device I/Os. The ExpressCLK is a special-purpose clock that serves the I/O registers, but can be driven to the internal array through special routing in the middle of the device, if desired. The ExpressCLK is characterized by being a very fast, lightly loaded clock distribution signal. Those skilled in the art will understand that the present invention can be implemented in PCMs that generate more than two different output clocks having different rates.

Although the present invention has been described in the context of a PCM for an FPGA, those skilled in the art will understand that the present invention can also be embodied in a PCM implemented on other types of programmable logic devices that contain programmable logic served by a clock network, or any other device that has variable loading on the clock distribution network. It could also be implemented in any device requiring clock multiplication, clock duty-cycle adjustment, or clock-delay adjustment on a programmable basis. Some of the particular uses would include those involved in telecom, datacom, and reconfigurable computing applications.

In the embodiment of FIG. 2, the DLL mode supports clock delay, duty-cycle adjustment, and clock doubling, while the PLL mode supports clock-delay minimization and clock multiplication. In alternative embodiments, the PCM could be designed with a DLL mode that supports a clock multiplication function and/or a PLL mode that supports duty-cycle adjustment and/or random clock-phase adjustment.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A programmable logic device (PLD) having at least one programmable clock manager (PCM), wherein the PCM is adapted to convert an input clock into at least one output clock and the PCM is adapted to be programmed during PLD operations, without reconfiguring the PLD.

2. The invention of claim 1, wherein the PLD is a field programmable gate array (FPGA).

3. The invention of claim 1, wherein the PCM is controlled by user-accessible registers that can be reset and/or reprogrammed to alter PCM operations without reconfiguring the PLD.

4. The invention of claim 1, wherein the PCM is adapted to be operated in a delay-locked loop (DLL) mode and a phase-locked loop (PLL) mode, wherein:

the DLL mode supports functions for clock delay, duty-cycle adjustment, and clock-frequency doubling; and the PLL mode supports functions for clock-delay minimization and clock multiplication.

5. The invention of claim 4, wherein the DLL mode supports combination of the duty-cycle adjustment and clock-frequency doubling operations such that the duty cycle of each doubled clock cycle is independently adjusted.

6. The invention of claim 4, wherein the DLL duty-cycle adjustment function is adapted to adjust the duty cycle of the output clock based on a percentage of the input clock period and the DLL clock-delay function is adapted to adjust the phase of the output clock based on a percentage of the input clock period.

7. The invention of claim 4, wherein the DLL mode supports clock multiplication.

8. The invention of claim 4, wherein the PCM is adapted to be reprogrammed between the DLL mode and the PLL mode during PLD operations, without reconfiguring the PLD.

9. The invention of claim 4, wherein the PLL mode supports duty-cycle adjustment.

10. The invention of claim 4, wherein the PLL mode supports random clock phase adjustment.

11. The invention of claim 1, wherein the PCM is adapted to be disabled to save power, when the input clock is not converted by the PCM.

12. The invention of claim 1, wherein the PCM is adapted to be used as a system component independent of the PLD, such that the PCM is adapted to be reset and/or reprogrammed without affecting the rest of the PLD, and the rest of the PLD can be reset and/or reprogrammed without affecting the PCM.

13. The invention of claim 1, wherein the PCM converts the input clock into the at least one output clock by modifying at least one timing characteristic of the input clock.

14. The invention of claim 13, wherein the timing characteristic is a clock phase of the input clock.

15. The invention of claim 13, wherein the timing characteristic is a clock frequency of the input clock.

16. The invention of claim 13, wherein the timing characteristic is a clock duty cycle of the input clock.

* * * * *